United States Patent
Kiryu

(10) Patent No.: US 7,266,745 B2
(45) Date of Patent: Sep. 4, 2007

(54) PROGRAMMABLE SCAN SHIFT SPEED CONTROL FOR LBIST

(75) Inventor: Naoki Kiryu, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 290 days.

(21) Appl. No.: 11/049,522

(22) Filed: Feb. 2, 2005

(65) Prior Publication Data

US 2006/0174178 A1   Aug. 3, 2006

(51) Int. Cl.
*G01R 31/28*   (2006.01)

(52) U.S. Cl. ..................... 714/731; 714/733

(58) Field of Classification Search ............... 714/731
See application file for complete search history.

(56) References Cited

U.S. PATENT DOCUMENTS

| | | | | |
|---|---|---|---|---|
| 5,349,587 A | * | 9/1994 | Nadeau-Dostie et al. ... | 714/729 |
| 5,504,756 A | * | 4/1996 | Kim et al. .................. | 714/729 |
| 5,717,702 A | * | 2/1998 | Stokes et al. ............... | 714/730 |
| 5,774,474 A | * | 6/1998 | Narayanan et al. ......... | 714/726 |
| 5,783,960 A | * | 7/1998 | Lackey ....................... | 327/295 |
| 5,889,788 A | * | 3/1999 | Pressly et al. .............. | 714/726 |
| 5,954,832 A | | 9/1999 | LeBlanc | |
| 5,983,380 A | | 11/1999 | Motika et al. | |
| 6,407,567 B1 | | 6/2002 | Etter | |
| 6,760,873 B1 | | 7/2004 | Hao et al. | |
| 6,877,123 B2 | * | 4/2005 | Johnston et al. ........... | 714/731 |
| 6,901,546 B2 | * | 5/2005 | Chu et al. ................... | 714/738 |
| 6,966,021 B2 | * | 11/2005 | Rajski et al. ............... | 714/726 |
| 7,155,649 B2 | * | 12/2006 | Nakao et al. ............... | 714/726 |
| 2002/0121913 A1 | | 9/2002 | Miller et al. | |
| 2004/0103355 A1 | | 5/2004 | Correale et al. | |

FOREIGN PATENT DOCUMENTS

EP    454320 A1 * 10/1991

OTHER PUBLICATIONS

"A methodology for testing high-performance circuits at arbitrarily low test frequency" by Nummer et al. Proceedings of the IEEE VLSI Test Symposium 2001. p. 68-74.*

* cited by examiner

Primary Examiner—Cynthia Britt
(74) Attorney, Agent, or Firm—Law Offices of Mark L. Berrier

(57) ABSTRACT

Systems and methods for performing logic built-in-self-tests (LBISTs) in digital circuits, where scan shift operations of the LBIST circuitry are performed at reduced rates. In one embodiment, a base clock signal is gated before being provided to LBIST circuitry. The clock signal is gated to produce an effective clock rate that is reduced in one or more steps from a first rate that is used in a functional phase of LBIST testing to a reduced rate that is used in a scan shift phase. The effective clock rate is stepped back up at the end of the scan shift phase to the first rate which is used in the following functional phase.

13 Claims, 7 Drawing Sheets

PROGRAMMABLE SCAN SHIFT SPEED CONTROL FOR LBIST

BACKGROUND

1. Field of the Invention

The invention relates generally to the testing of electronic circuits, and more particularly to systems and methods for controlling the execution of LBIST test cycles to reduce the amount of power used by a device under test.

2. Related art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device at normal operating speeds to ensure that it continues to operate properly during normal usage.

One way to test for defects in a logic circuit is a deterministic approach. In a deterministic method, each possible input pattern is applied at the inputs of the logic circuit, with each possible set of state values in the circuit. The output pattern generated by each set of inputs and state values is then compared with the expected output pattern to determine whether the logic circuit operated properly. If the number of possible input patterns and state values is high, however, the cost of deterministic testing of all the combinations is generally too high for this methodology to be practical. An alternative method of testing that has a lower cost is therefore desirable.

One alternative is a non-deterministic approach in which pseudorandom input test patterns are applied to the inputs of the logic circuit. The outputs of the logic circuit are then compared to the outputs in response to the same pseudorandom input test patterns by a logic circuit that is known to operate properly. If the outputs are the same, there is a high probability that the logic circuit being tested also operates properly. The more input test patterns that are applied to the logic circuits, and the more random the input test patterns, the greater the probability that the logic circuit under test will operate properly in response to any given input pattern. This non-deterministic testing approach is typically easier and less expensive to implement than a deterministic approach.

One test mechanism that can be used to implement a deterministic testing approach is a built-in self test (BIST). This may also be referred to as a logic built-in self test (LBIST) when applied to logic circuits. BIST and LBIST methodologies are generally considered part of a group of methodologies referred to as design-for-test (DFT) methodologies. DFT methodologies impact the actual designs of the circuits that are to be tested. LBIST methodologies in particular involve incorporating circuit components into the design of the circuit to be tested, where the additional circuit components are used for purposes of testing the operation of the circuit's logic gates.

In a typical LBIST system, LBIST circuitry within a device under test includes a plurality of scan chains interposed between levels of the functional logic of the device. Typically, pseudorandom patterns of bits are generated and stored in the scan chains. This may be referred to as scanning the data into the scan chains. After a pseudorandom bit pattern is scanned into a scan chain, the data is propagated through the functional logic to a subsequent scan chain. The data is then scanned out of the subsequent scan chain. This test cycle is typically repeated many times (e.g., 10,000 iterations,) with the results of each test cycle being combined in some manner with the results of the previous test cycles. After all of the scheduled test cycles have been completed, the final result is compared to a final result generated by a device that is known to operate properly. Based upon this comparison, it is determined whether the device under test operated properly.

While this methodology is useful it requires more power than would normally be consumed by the chip/circuitry. This is because more of the circuitry is active during testing than during typical operating conditions. Therefore, more current must be routed through the chip, and the testing equipment must provide more power, thereby increasing the cost of such equipment. Additionally, the use of more power by the chip during LBIST testing may increase temperature levels in the chip, which may necessitate greater heat dissipation capabilities, or which may possibly harm the chip.

It would therefore be desirable to provide systems and methods for performing LBIST testing on a device at lower power levels.

SUMMARY OF THE INVENTION

One or more of the problems outlined above may be solved by the various embodiments of the invention. Broadly speaking, the invention comprises systems and methods for performing logic built-in-self-tests (LBISTs) in digital circuits, where scan shift operations of the LBIST circuitry are performed at reduced rates. In one embodiment, pseudorandom bit patterns are scanned into the scan chains interposed between portions of the functional logic circuit. The pseudorandom bit patterns are then propagated through the functional logic. The resulting bit patterns are captured in scan chains following the functional logic and are then scanned out of the scan chains. Because of the large number of shift operations that are performed, the scanning of bit patterns into and out of the scan chains typically requires much more power than normal operation of the functional logic. The scan shift logic is therefore operated at a lower rate than that of the functional logic in order to reduce the amount of power required during the scan shift phase. Further, since sudden reductions in the amount of current drawn by the chip can be problematic, the rate at which scan shift operations are performed is reduced in steps. During the scan shift phase, the rate is initially stepped down to a minimum rate and then is stepped back at the end of the scan shift phase.

The invention may be implemented in a variety of ways, and various exemplary embodiments will be described in detail below. In one embodiment, a method includes executing test cycles of an LBIST system in a device under test. Each test cycle has a functional phase and a scan shift phase. In the functional phase, functional operations (propagating data through functional logic of the device under test) are performed. In the scan shift phase, scan shift operations (scanning data into and out of scan chains interposed between portions of the functional logic) are performed. An LBIST controller is coupled to the LBIST circuitry and configured to generate control signals to control the LBIST circuitry. The LBIST controller is configured to manage test cycles of the LBIST circuitry, including initiating a functional phase, initiating a scan shift phase, and controlling the clock rate at which operations are performed. In this embodiment the operations of the scan shift phase are performed at a rate which is lower than the rate of the functional phase. Because immediately changing from a relatively high rate in the functional phase to a relatively low rate in the scan shift phase may introduce an unacceptably large change in current (di/dt), the scan rate used during the scan shift phase is reduced in stages. The rate is stepped down from the functional rate in stages to a target rate and then back up to the functional rate, thus avoiding an unacceptable current change (di/dt). This obviates the introduction of an undesirable time lag between the last operation in the functional phase and the first operation of the scan shift phase, as was required in conventional systems.

Another embodiment comprises an LBIST controller that is coupled to LBIST circuitry implemented in a device under test, and configured to generate control signals to control the LBIST circuitry. The LBIST controller is configured to manage test cycles of the LBIST circuitry, including initiating a functional phase, initiating a scan shift phase, and setting execution rates of the scan shift phase. The scan rate used during the scan shift phase is reduced in stages, stepping down from the functional rate in stages to a target rate and then back up to the functional rate thus avoiding an unacceptable current change (di/dt) and obviating the introduction of an undesirable time lag between the last operation in the functional phase and the first operation of the scan shift phase.

Another embodiment comprises a method including performing one or more test cycles of an LBIST system in a device under test where each of the test cycles includes a functional phase and a scan shift phase. In the functional phase, data is propagated through functional logic of the device under test at a functional rate. In the scan shift phase, data is scanned into and out of a set of scan chains at one or more scan rates which are less than the functional rate.

In one embodiment, The series of scan rate decrease in one or more steps from an initial scan rate to a minimum scan rate and then increase in one or more steps from the minimum scan rate to a final scan rate.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
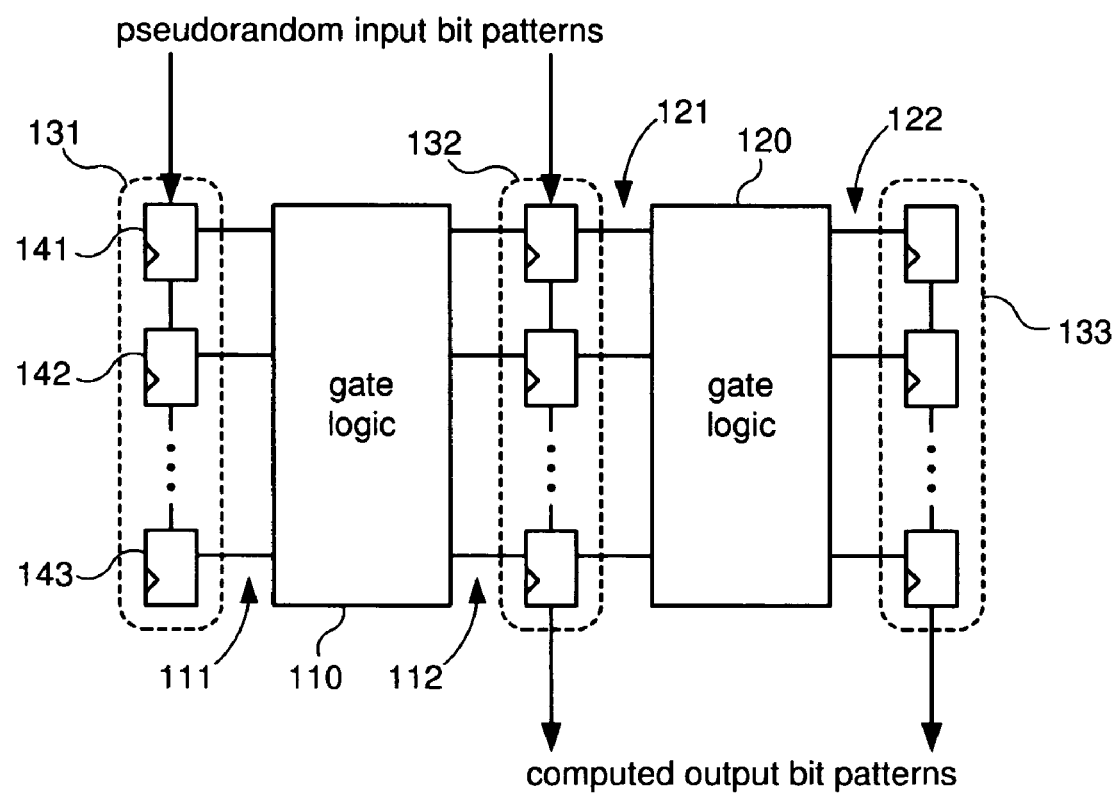
FIG. 1 is a functional block diagram illustrating the principal operation of a simple STUMPS LBIST system.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for performing logic built-in-self-tests (LBISTs) in digital circuits, where the operation of the LBIST circuitry is performed at different rates during different portions of each test cycle.

In one embodiment, a STUMPS-type LBIST test architecture is incorporated into the design of a logic circuit. The LBIST components include a set of scan chains interposed between portions of the functional logic of the logic circuit. Pseudorandom bit patterns are scanned into the scan chains so that the pseudorandom bit patterns can be propagated through the functional logic following the scan chains. The resulting bit patterns are captured in scan chains following the functional logic and then scanned out of these scan chains.

The LBIST circuit performs functional operations at one rate, and scan shift operations at one or more reduced rates. The scan rate is reduced from the functional rate in one or more steps to a target (minimum) scan rate and is then increased in one or more steps back to the functional rate.

The various embodiments of the invention may provide a number of advantages over conventional systems. For example, the power consumed by the circuit under test is reduced. This reduces the power needed to be supplied by the testing equipment, and obviates the need for more expensive testing equipment (reducing the cost of acquiring or modifying testing equipment). The reduction in power consumption may also reduce the amount of heat to be dissipated, thus reducing such demands of the testing equipment and reducing the possibility of damaging the chip as a result of the heat.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Referring to FIG. 1 a functional block diagram illustrating the principal operation of a simple STUMPS LBIST system is shown. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit that is output by functional logic 110. After these output bits are stored in the latches of scan chain 132, the output data bits can be shifted through the series of latches and provided as a computed output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
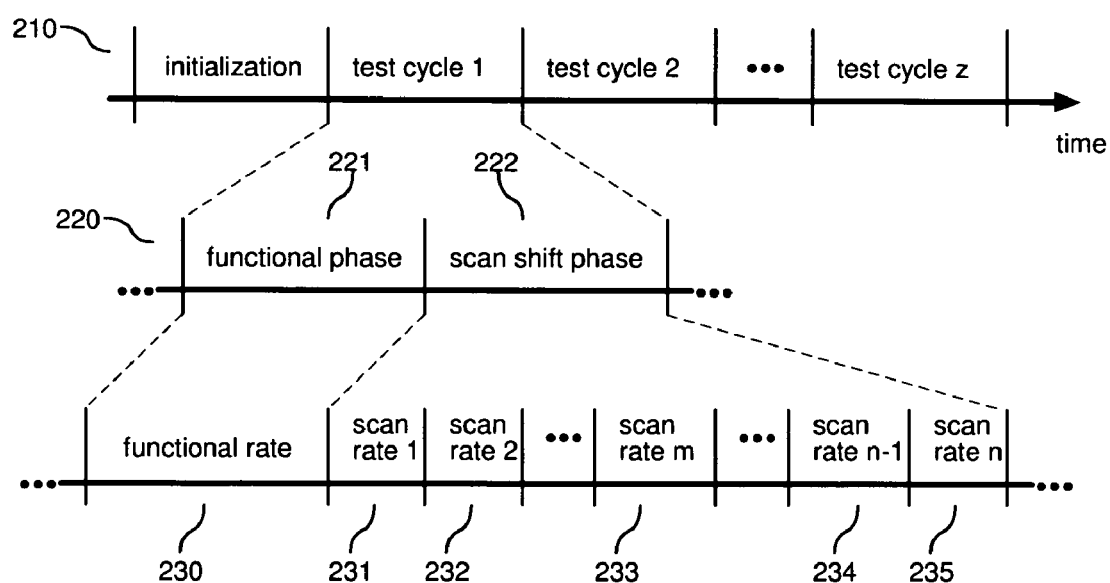
FIG. 2 is a diagram illustrating the phases of operation of the LBIST system in accordance with one embodiment.

Referring to FIG. 2, a diagram illustrating the phases of operation of the LBIST system in accordance with one embodiment is shown. FIG. 2 shows three different phases of operation of the LBIST system: initialization; function; and scan shift. In the initialization phase, the various components of the system are prepared for normal operation. This may include resetting various components, providing a seed for a pseudorandom number generator, setting values in registers, and so on. In the function phase, data is propagated through the functional logic of the device in which the LBIST system is implemented. In the scan shift phase, data is scanned into and out of the scan chains of the LBIST system.

As shown in FIG. 2, operation of the LBIST system begins with the initialization phase (210). As noted above, the various components of the system are prepared for operation during this phase. As will be discussed in more detail, several counters, including a mode counter and a shift register cycle counter, are reset. It may be necessary to ensure that several registers (e.g., function register, scan register) have the appropriate values stored therein, as will also be discussed below. Because the first test cycle in the embodiment depicted in FIG. 2 begins with a functional phase (221), it is also necessary for the initialization phase to generate a first set of pseudorandom bit patterns and to load these bit patterns into the scan chains that are interposed between the functional logic of the device under test. After these operations are performed, the LBIST system is ready for operation.

Following the initialization phase, the LBIST system begins a first test cycle 220 that includes a functional phase 221 and a scan shift phase 222. During the functional phase, the data that was scanned into the scan chains is propagated through the functional logic of the device under test. The functional operations in this phase may, for example, be performed at the normal operating speed of the chip (e.g., 1 Ghz.) At the end of this functional phase, the output of the functional logic is captured by the scan chains. As noted above, a scan chain that is positioned between successive functional logic blocks serves to both provide inputs to one of the functional logic blocks and capture the outputs of the other of the functional logic blocks. The data that is captured in the scan chains at the end of the functional phase is scanned out of the scan chains during the scan shift phase. At the same time the captured data is scanned out of the scan chains, new pseudorandom bit patterns are scanned into the scan chains to prepare for the functional phase of the next test cycle.

As shown in FIG. 2, the operations in functional phase 221 are performed using a clock signal at a functional rate 230. The operations in scan shift phase 222 are performed using a clock signal that has a varying rate. The rate in the scan shift phase starts at a first rate 231 (scan rate 1) and then changes to a second rate 232 (scan rate 2) and possibly several more rates (233-234) before ending at rate 235 (scan rate 5) at the end of the scan shift phase. In the functional phase that follows the scan shift phase, the rate returns to functional rate 230.

In one embodiment, scan rate m (233) is a minimum clock rate. The clock in the scan shift phase begins at initial scan rate 231 and steps down one or more times (e.g., 232) until the minimum rate is reached. The rate then steps up one or more times (e.g., 234) until the final rate is reached. The number of steps down and back up need not be the same, nor do they need to be the same values, although the rates are conveniently implemented in this manner.

The data that was captured in the scan chains can be processed and examined to determine whether the functional logic blocks performed correctly. In one embodiment, the captured data from all of the scan chains in the system is compacted and provided to a multiple input signature register (MISR). The compacted data is combined with data already stored in the MISR to produce a new signature value in the MISR. Typically, this is repeated for each of a predetermined number of test cycles (e.g., 10,000,) and the resulting signature value is compared with a known value generated by a good chip. If the signature values match, the device under test has functioned properly. If the signature values do not match, the device under test has malfunctioned. (Although the comparison is performed in this embodiment after many test cycles, it may be performed after several test cycles, or even after each test cycle, in other embodiments.

Figure 3:
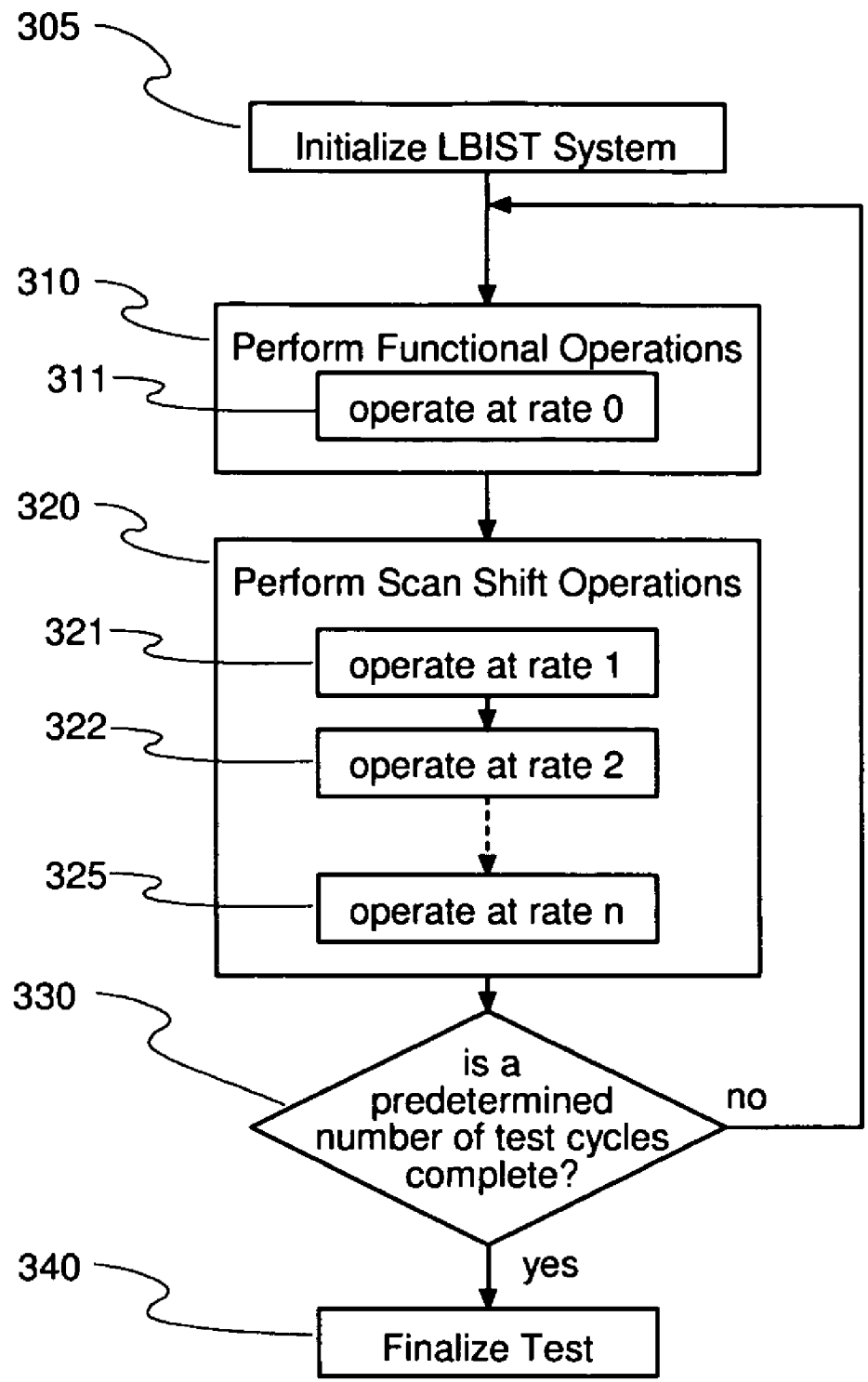
FIG. 3 is a flow diagram illustrating the initialization of an LBIST system and the performance of repeating test cycles in accordance with one embodiment.

The operation of the LBIST system is summarized in FIG. 3. FIG. 3 is a flow diagram illustrating the initialization of the system (305) and the repeating test cycles (including functional phase 310 and scan shift phase 320) that are performed at a number of rates (see 311, 321, 322, 325).

Referring to FIG. 3, operation of the system begins with the initialization of the LBIST components (block 305.) During the initialization phase, an initial bit pattern is scanned into the scan chains. After the system is initialized, it enters a functional phase, including propagating data from the scan chains through the functional logic and capturing the resulting bit patterns in the scan chains (block 310.) The operations of the functional phase are performed at the functional rate of rate 0 (block 311). Next, the system executes the scan shift phase. In this phase, the captured bit patterns are scanned out of the scan chains while new pseudorandom bit patterns are scanned into the scan chains (block 320.) The operations of the scan shift phase are performed at a series of rates. The scan shift operations are performed, first at scan rate 1 (block 321), then scan rate 2 (block 322), and so forth for some number of rates (as implied by the dashed line,) until reaching the final rate of scan rate n (block 325). Then, the system determines whether the predetermined number of test cycles has been completed, or whether execution of the LBIST testing will continue with a subsequent test cycle (block 330). Illustrated here a test of the number of left cycles. An addition could be an examination to determine if the circuitry has malfunctioned If it is determined that the testing will continue, the system executes another test cycle consisting of a functional phase (block 305,) and a scan shift phase (block 320).

It should be noted that the embodiment depicted in FIGS. 2 and 3 allows for a variable number of scan rates that can be implemented in a variety of ways. For example, the rates could be specified such that there is a set of strictly descending rates, a minimum rate, and a set of strictly ascending rates. The number of descending and ascending rates may (or may not) be equal. Similarly, the specific descending rates may (or may not) be equal to the specific ascending rates. The following exemplary embodiment illustrates LBIST circuitry with a Clock Control Block which produces a gating signal that cycles through a series of rates. Alternative embodiments may control the clock rates used in the scan shift phase in a different manner.

Figure 4:
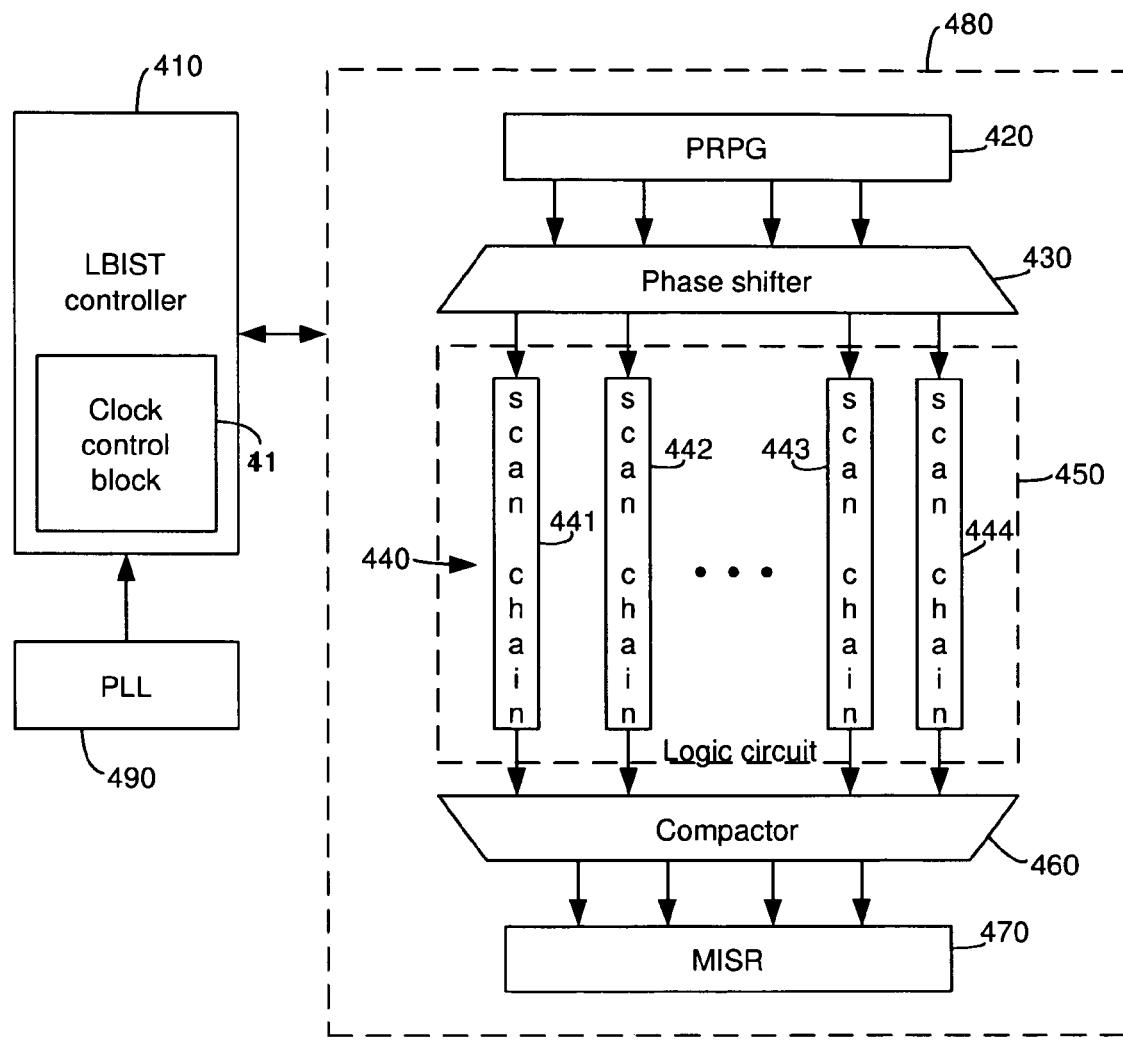
FIG. 4 is a functional block diagram illustrating an LBIST architecture that can be used in conjunction with the testing of large-scale logic circuits in accordance with one embodiment.

In one embodiment, the LBIST system is implemented as shown in the functional block diagram of FIG. 4. As depicted in FIG. 4, the STUMPS architecture comprises an LBIST controller 410, a PRPG 420, a phase shifter 430, a set of scan chains 440, a compacter 460 and a MISR 470. These LBIST components are integrated with a logic circuit 450, which the LBIST components are designed to test. (It should be noted that, while only four scan chains are depicted in FIG. 4, there may be many scan chains in the LBIST design.)

LBIST controller 410 includes control circuitry that controls the operation of the remainder of the LBIST components 480. (For purposes of clarity, LBIST controller 410 is depicted as being coupled to LBIST components 480 as a group, although the controller is typically coupled directly to each of the components.) One of the functions of LBIST controller 410 is to provide a seed value to PRPG 420. Based upon this seed value, PRPG 420 generates a pseudorandom sequence of bits that are processed by phase shifter 430 and loaded into scan chains 440. Another function provided by the Clock Control Block 411, is to set scan rates (for example, by gating the PLL base clock).

The purpose of the pseudorandom sequence of bits generated by PRPG 420 is to provide a set of input bits to be propagated through the functional logic components of logic circuit 450. In the absence of phase shifter 430, almost the same bit sequence would be provided to each of the scan chains (the sequences in successive chains would typically be shifted by one bit.) The purpose of phase shifter 430 is to shift the bit sequences so that no readily identifiable pattern exists between the sequences in successive scan chains.

The pseudorandom bit patterns that are generated by PRPG 420 and phase shifter 430 are loaded into scan chains 440. Each of scan chains 440 comprises a series of scan latches that are configured to alternately shift data (the pseudorandom bit patterns or functional logic output) through the scan chains or to hold data that has been propagated through the functional logic. As indicated above, a separate sequence is loaded into each of scan chains 440. Each of scan chains 440 is positioned before or after (interposed with) respective portions of logic circuit 450. Thus, for each portion of logic circuit 450, there is a scan chain which precedes this portion and provides inputs to the corresponding logic, as well as a scan chain which follows this portion and receives the output of the corresponding logic. For example, one portion of logic circuit 450 may receive input bits from scan chain 441 and provide output bits to scan chain 442. Another portion of logic circuit 450 may receive input bits from scan chain 443 and provide output bits to scan chain 444. Some of scan chains 440 may serve both to provide input bits to a succeeding portion of logic circuit 450 and to receive output bits from a preceding portion of logic circuit 450.

After the pseudorandom bit patterns have been allowed to propagate through the functional components of logic circuit 450 and the results have been captured in scan chains 440, the contents of scan chains 440 are scanned out of the scan chains (i.e., they are unloaded from the scan chains) to compactor 460 and MISR 470.

When the bits from scan chains 440 have been compacted by compactor 460, they are provided to MISR 470. MISR 470 updates the current value in the MISR according to the output of compactor 460 (e.g., by performing a modulo operation—dividing the current value by the compactor value and retaining the remainder.) The value stored in MISR 470 can then be compared to an expected value. If the stored value does not match the expected value, then one or more of the operations performed by the functional components of logic circuit 450 failed, thereby providing an incorrect data bit in the output scan chain, which then propagated through compactor 460 to MISR 470.

The operation of LBIST components 480 is controlled by LBIST controller 410, which generates the control signals necessary to execute the phases of operation depicted in FIG. 2 (i.e., the initialization, function and scan shift phases.) The generation of these control signals is performed in this embodiment by clock control block 411, based upon a clock signal generated by PLL 490.

Figure 5:
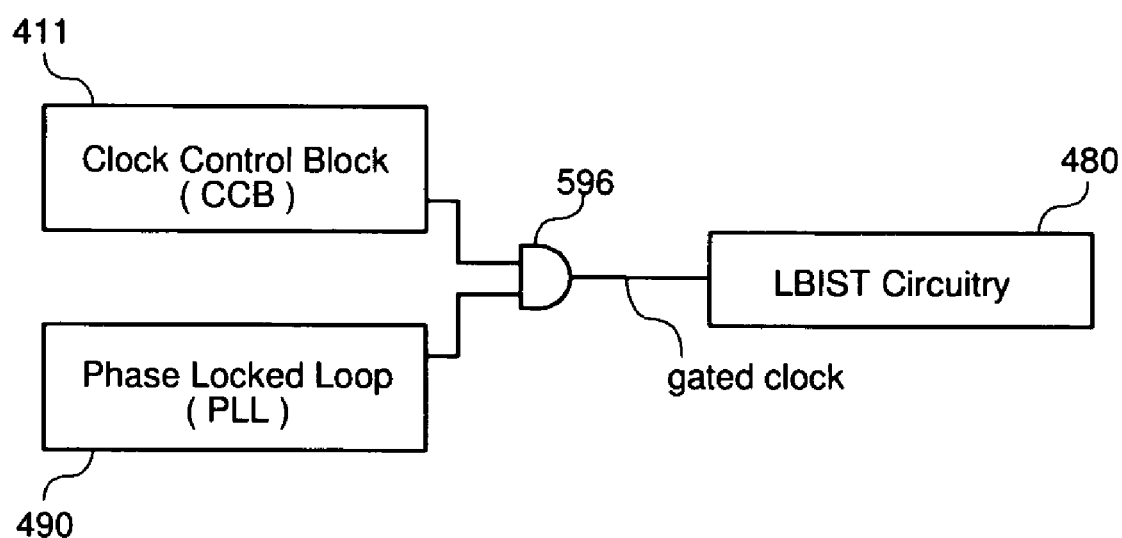
FIG. 5 is a functional block diagram illustrating the gating of the clock signal in accordance with one embodiment.

Referring to FIG. 5, a diagram illustrating the generation of gated clock signal provided to the LBIST circuitry in accordance with one embodiment is shown the LBIST circuitry execution rates are controlled by gating a base clock rate provided by Phase Locked Loop (PLL) 490. Clock Control Block (CCB) 411 selectively asserts a gating signal based on the desired clock rate. The signals from CCB 411 and PLL 490 are input into AND gate 596, and the resulting gated clock signal is used by LBIST circuitry 480.

Figure 6:
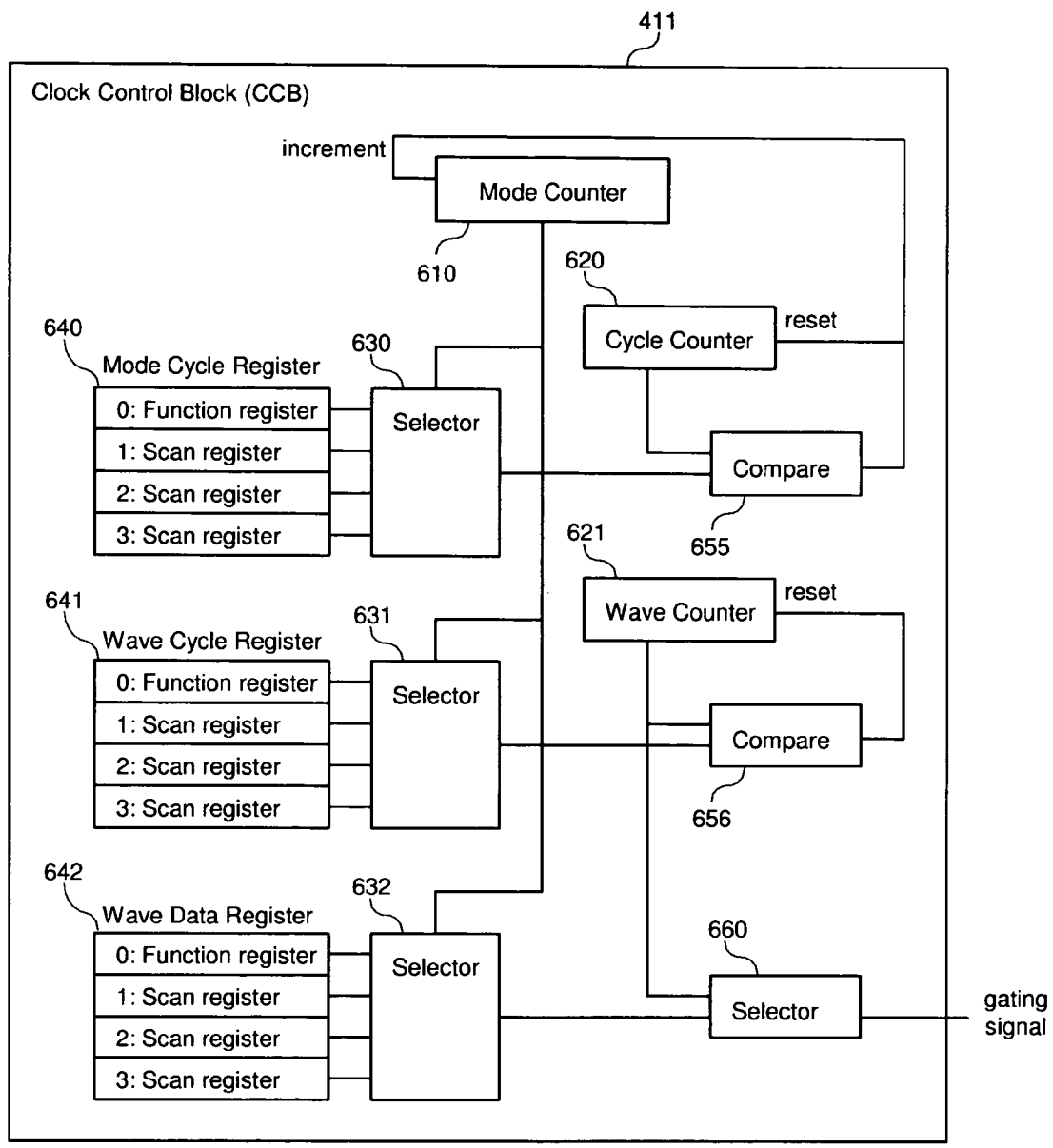
FIG. 6 is a functional block diagram illustrating the structure of a clock control block in accordance with the embodiment of FIG. 5.

Referring to FIG. 6, a functional block diagram illustrating the structure of clock control block 411 in accordance with one embodiment is shown. As depicted in this figure, clock control block 411 includes a binary mode counter 610, a LFSR cycle counter 620, register selectors 630, 631 and 632, a mode cycle register 640, a wave cycle register 641, a wave data register 642 a first comparator 655, a second comparator 656 and a selector 660.

Clock control block 411 is configured in this embodiment to generate a gating signal. Clock control block 411 includes binary mode counter 610, which cycles through the values 0-n. Each of these values corresponds to one of the modes in which the LBIST system operates. (The number of modes can be variable and read from a register.) This counter increments when the mode counter increment signal from compare 655 goes high. Mode 0 corresponds to the functional phase of the LBIST operation, while modes 2-n correspond to the scan shift phases, The value of binary mode counter 610 is provided to register selectors 630, 631, and 632. Selector 660 determines the value of the gating signal according to the bit position identified by the value received from wave counter 621 and bit pattern received from register selector 632. Each time a particular bit position is received by selector 660, the corresponding bit of the pattern from selector 632 is asserted as appropriate.

Register selectors 630, 631, and 632 also operate based upon the value of binary mode counter 610. Register selector 630, uses this value to select one of the registers of mode cycle register 640. The selected one of these registers holds a value that indicates the number of cycles in the corresponding mode (the value is one less than the number of cycles). This value is provided by register selector 630 to comparator 655. Register selector 631 uses the value of binary mode counter 610 to select one of the registers of wave cycle register 641. The selected one of these registers holds a mask value that indicates which bits of the pattern specified in the corresponding wave data register should be considered, and which bits should be disregarded. In one embodiment, the value in the selected one of wave cycle registers 641 indicates the highest bit position (length minus one) of the pattern specified in the corresponding wave data register. This value is provided by register selector 631 to comparator 656.

Register selector 632 uses the value of binary mode counter 610 to select one of the registers of wave data register 642. The selected one of these registers holds a pattern of bits that indicates which pulses of the base clock signal will be blocked, and which will not. For example, if the bit pattern is "001", two of every three pulses of the base clock will be blocked. If the bit pattern is "011", one of every three pulses of the base clock will be blocked. The value in wave data register 642 is provided by register selector 632 to selector 660.

Comparator 655 compares the value provided by register selector 630 to the value provided by cycle counter 620. Whenever the value provided by cycle counter 620 matches the value provided by register selector 630, comparator 655 asserts a signal that increments the Mode Counter and also resets Cycle Counter 620.

Comparator 656 compares the values provided by register selector 631 to the value provided by Wave Counter 621. Whenever the value provided by Wave Counter 621 matches the wave cycle value provided by register selector 631, comparator 656 asserts a signal that resets Wave Counter 621.

Selector 660 uses the value provided by Wave Counter 621 to select a bit from the Wave Data value (bit pattern) provided by selector 632. If the selected bit is ON (1), selector 660 asserts the gating signal (which is input into AND gate 596). AND gate 596 combines the gating signal provided by selector 660 with the clock signal provided by PLL 490. If both the gating signal and PLL (clock) signal are asserted, a clock pulse is sent to the LBIST circuitry, advancing the data by one clock cycle (e.g., shifting data by one bit in the scan shift phase.)

Figure 7:
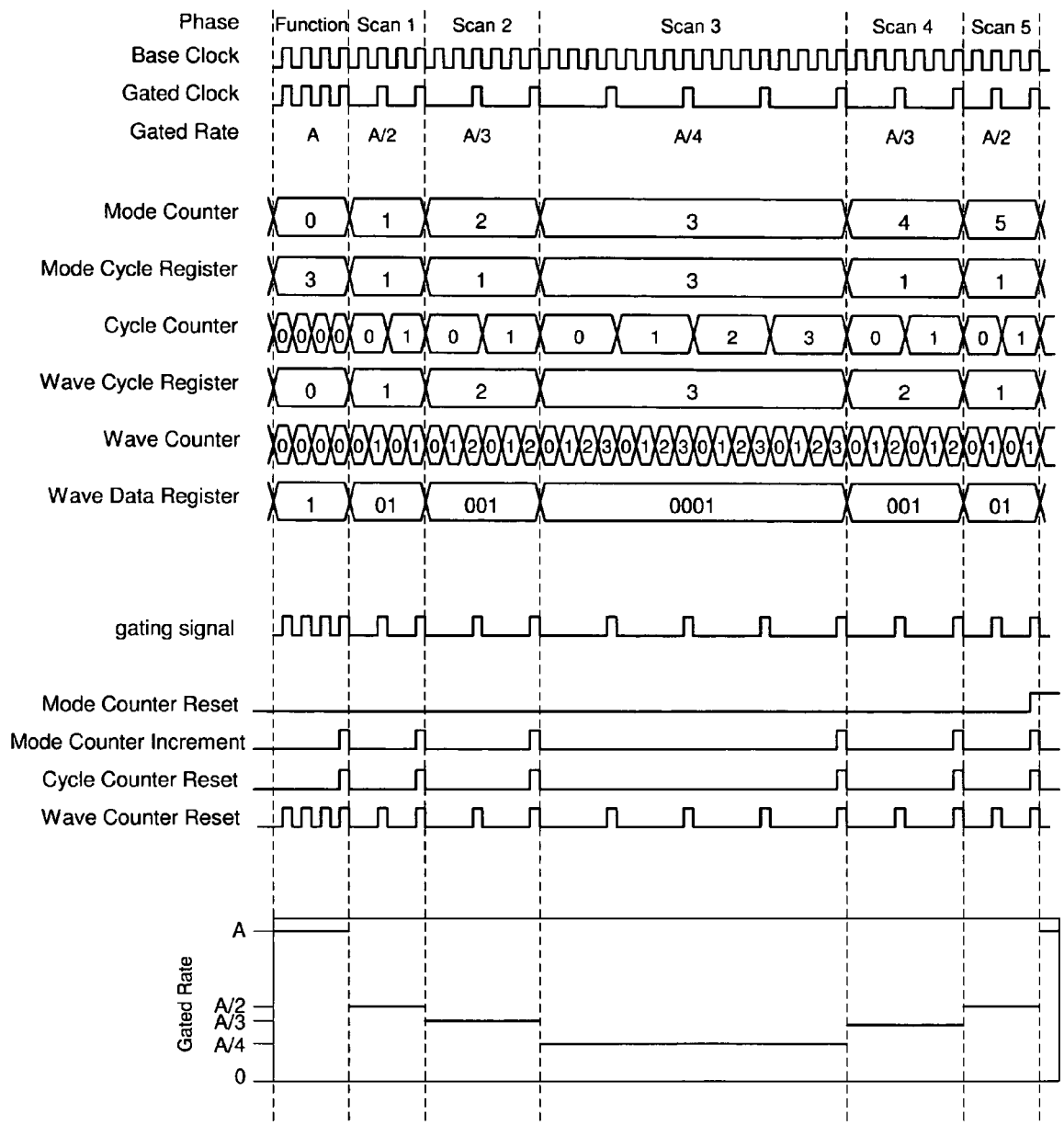
FIG. 7 is a diagram illustrating the timing of control signals generated by the clock control block in accordance with the embodiment of FIG. 6.

Clock control block 411 therefore generates the control signals as illustrated in FIG. 7. As shown in the figure, each test cycle begins with a functional phase (mode 0.) In this embodiment, the functional phase lasts for four cycles. The functional phase is followed by a series of scan shift phases (modes 1 through n.) The combined scan shift phases last for N cycles, where N is the number of cycles required to replace the current bit pattern in each scan chain with a new bit pattern (hence to read all of the current bit pattern out of the scan chains). Here, illustrated are 12 such cycles (N=12) (It should be understood that, although only 12 cycles are shown in the figure, the figure is only for the purposes of illustration, and many more cycles are typically required to scan data into and out of a set of LBIST scan chains.) Following the scan shift phase, the mode counter goes to zero (is reset) and another test cycle started.

In this embodiment the base clock rate is A. The functional rate is set to the base rate A. The descending scan rates 731 and 732 are A/2 and A/3, respectively, and last for 4 and 6 base clock cycles, respectively. The target minimum scan rate 733 is A/4 and lasts for 16 base clock cycles. The ascending scan rates 734 and 735 are A/3 and A/2, respectively, and last for 6 and 4 base clock cycles, respectively. The result is 16 pulses. (It should be noted that different rates, e.g., 2A/3, 3A/4, etc., can be used in other embodiments.)

In this example, there are 40 pulses of the base clock signal during the scan shift phase. 24 of these pulses are gated (blocked,) resulting in 12 pulses during the entire scan shift phase. Because only 30% of the pulses of the base clock are passed on to the LBIST circuitry, only 30% of the scan shift operations that would have occurred at the full base clock rate are actually performed. Consequently, only 30% of the power is required (as compared to operation at the full base clock rate,) and the reduced number of operations is achieved with a stepped reduction in the clock rate which avoids large changes in current (di/dt) and the problems that result from these changes.

While the foregoing description presents several specific exemplary embodiments, there may be many variations of the described features and components in alternative embodiments. For example, the values of the scan rates preceding and following a target (minimum) scan rate need not be the same. In another possible variation, the number of stepped descending rates need not be the same as the number of stepped ascending rates. In yet another variation, the scan shift operations of different scan shift chains may be interleaved (such that their operations do not occur at the same moments) to reduce the peak power required. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention.

Thus, the present invention is not intended to be limited to the embodiments shown herein but is to be accorded the widest scope consistent with the principles and novel features disclosed herein and recited within the following claims.

What is claimed is:

1. A method comprising
performing one or more test cycles of an LBIST system in a device under test; wherein each of the test cycles includes
  performing a functional phase in which data is propagated through functional logic of the device under test at a functional rate, and
  performing a scan-shift phase in which data is scanned into and out of a plurality of scan chains at a series of scan rates which are different from the functional rate, wherein the series of scan rates include
    one or more descending intermediate scan rates which are less than the functional rate and faster than a minimum scan rate, wherein each descending intermediate scan rate is progressively less than the preceding rate, followed by
    the minimum scan rate, followed by
    one or more ascending intermediate scan rates which are greater than the minimum scan rate and less than the functional rate, wherein each ascending intermediate scan rate is progressively greater than the preceding rate.

2. The method of claim 1, further comprising, performing the scan-shift phase at a series of scan rates wherein the series of scan rates include
  an initial scan rate, followed by
  a minimum scan rate, followed by
  a final scan rate;
  wherein the initial scan rate is less than the functional rate and greater than the minimum scan rate; and
  wherein the final scan rate is greater than the minimum scan rate and less than the functional rate.

3. The method of claim 1, wherein the number of descending intermediate scan rates is equal to the number of ascending intermediate scan rates.

4. The method of claim 1, wherein the number of descending intermediate scan rates is not equal to the number of ascending intermediate scan rates.

5. The method of claim 1, wherein the set of descending intermediate scan rates is not the same as the set of ascending intermediate scan rates.

6. A system comprising:
  an LBIST controller configured to generate control signals to control LBIST circuitry implemented in a device under test;
  wherein the LBIST controller is configured to
    generate a clock signal for operating the LBIST circuitry, wherein the clock signal has a functional rate during a functional phase of LBIST testing, and one or more scan rates during a scan shift phase of LBIST testing, wherein the one or more scan rates include one or more descending intermediate scan rates which are less than the functional rate and faster than a minimum scan rate, wherein each descending intermediate scan rate is progressively less than the preceding rate, followed by the minimum scan rate, followed by one or more ascending intermediate scan rates which are greater than the minimum scan rate and less than the functional rate, wherein each ascending intermediate scan rate is progressively greater than the preceding rate.

7. The system of claim 6, wherein the number of descending intermediate scan rates is equal to the number of ascending intermediate scan rates.

8. The system of claim 6, wherein the number of descending intermediate scan rates is not equal to the number of ascending intermediate scan rates.

9. The system of claim 6, wherein the set of descending intermediate scan rates is not the same as the set of ascending intermediate scan rates.

10. The system of claim 6, wherein the LBIST controller is configured to generate the clock signal by selectively gating pulses of a base clock signal received from a phase locked loop (PLL).

11. The system of claim 10, wherein the functional rate is the rate of the base clock signal.

12. The system of claim 10, wherein the LBIST controller includes a first register configured to store a first series of bits defining a bit pattern and wherein the LBIST controller is configured to gate pulses of the base clock in a pattern matching the bit pattern stored in the first register.

13. The system of claim 12, wherein the LBIST controller includes a second register configured to store a second series of bits defining a mask pattern and wherein the LBIST controller is configured to apply the mask pattern to the first series of bits stored in the first register to determine the bit pattern stored in the first register.

* * * * *